(12) United States Patent
Saito et al.

(10) Patent No.: US 9,343,536 B2
(45) Date of Patent: May 17, 2016

(54) SEMICONDUCTOR DEVICE

(71) Applicant: Kabushiki Kaisha Toshiba, Minato-ku, Tokyo (JP)

(72) Inventors: Wataru Saito, Kawasaki Kanagawa (JP); Kazuo Tsutsui, Yokohama Kanagawa (JP); Hiroshi Iwai, Yokohama Kanagawa (JP); Kuniyuki Kakushima, Yokohama Kanagawa (JP); Hitoshi Wakabayashi, Chofu Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/621,879

(22) Filed: Feb. 13, 2015

(65) Prior Publication Data
US 2016/0043187 A1    Feb. 11, 2016

(30) Foreign Application Priority Data

Aug. 5, 2014   (JP) .................. 2014-159280

(51) Int. Cl.
| | | |
|---|---|---|
| H01L 29/15 | (2006.01) | |
| H01L 29/417 | (2006.01) | |
| H01L 29/778 | (2006.01) | |
| H01L 29/20 | (2006.01) | |
| H01L 29/205 | (2006.01) | |
| H01L 29/78 | (2006.01) | |
| H01L 29/423 | (2006.01) | |
| H01L 29/45 | (2006.01) | |
| H01L 29/49 | (2006.01) | |

(52) U.S. Cl.
CPC ...... *H01L 29/41725* (2013.01); *H01L 29/2003* (2013.01); *H01L 29/205* (2013.01); *H01L 29/4236* (2013.01); *H01L 29/452* (2013.01); *H01L 29/495* (2013.01); *H01L 29/7786* (2013.01); *H01L 29/7845* (2013.01)

(58) Field of Classification Search
CPC ............. H01L 29/41725; H01L 29/7786; H01L 29/2003; H01L 29/205; H01L 29/7845; H01L 29/4236; H01L 29/452; H01L 29/495
USPC ....................... 257/76, 189–194
See application file for complete search history.

(56) References Cited

U.S. PATENT DOCUMENTS

| | | | |
|---|---|---|---|
| 2008/0217625 A1* | 9/2008 | Kuroda et al. | ........... 257/76 |
| 2011/0233520 A1* | 9/2011 | Jeon et al. | ........... 257/20 |
| 2013/0264657 A1 | 10/2013 | Komatani et al. | |

FOREIGN PATENT DOCUMENTS

| | | |
|---|---|---|
| JP | 2011-228720 A | 11/2011 |
| JP | 2012-064663 A | 3/2012 |
| JP | 2013-214625 A | 10/2013 |
| JP | 2013-219151 A | 10/2013 |

\* cited by examiner

*Primary Examiner* — Thanh T Nguyen
(74) *Attorney, Agent, or Firm* — White & Case LLP

(57) ABSTRACT

A semiconductor device according to an embodiment includes a first semiconductor layer, a second semiconductor layer provided on the first semiconductor layer and having a wider band gap than the first semiconductor layer, a source electrode and a drain electrode provided on the second semiconductor layer, wherein at least one of the source electrode and the drain electrode includes a plurality of protrusions on a side in contact with the second semiconductor layer, and a gate electrode provided between the source electrode and the drain electrode.

18 Claims, 11 Drawing Sheets

A-A'

B-B'

SEMICONDUCTOR DEVICE

CROSS-REFERENCE TO RELATED APPLICATION

This application is based upon and claims the benefit of priority from Japanese Patent Application No. 2014-159280, filed on Aug. 5, 2014, the entire contents of which are incorporated herein by reference.

FIELD

Embodiments described herein relate generally to a semiconductor device.

BACKGROUND

Power semiconductor devices such as switching devices and diodes are used for circuits of switching power supplies and inverters. These power semiconductor devices are required to have a high breakdown voltage and low on resistance. Then, there is a tradeoff relationship between the breakdown voltage and the on resistance determined by a semiconductor material used for the devises.

With the progress of technological development heretofore, the low on resistance of silicon as a main device material has been realized close to limitations thereof for power semiconductor devices. To further reduce the on resistance, it is necessary to change the semiconductor material. By using a nitride semiconductor such as GaN or AlGaN or a wide band gap semiconductor such as silicon carbide (SiC) as the switching device material, the tradeoff relationship determined by the semiconductor material can be improved and dramatically lower on resistance can be expected.

Among devices using a nitride semiconductor such as GaN or AlGaN, devices that can easily achieve lower on resistance include, for example, a heterojunction field effect transistor (HFET) using AlGaN/GaN hetero structure. The HFET realizes low on resistance by high mobility of hetero interface channels and a high electron concentration generated by polarization. Accordingly, low on resistance is achieved even if the chip area of a device is small.

However, it is difficult to reduce interface resistance by forming an alloy between AlGaN or GaN and a metallic material of an electrode. This is because the diffusion coefficient of metal in AlGaN or GaN is small. Therefore, a problem is remained that contact resistance of a source electrode and a drain electrode cannot be reduced, leading to higher on resistance.

DETAILED DESCRIPTION

Figure 1A:
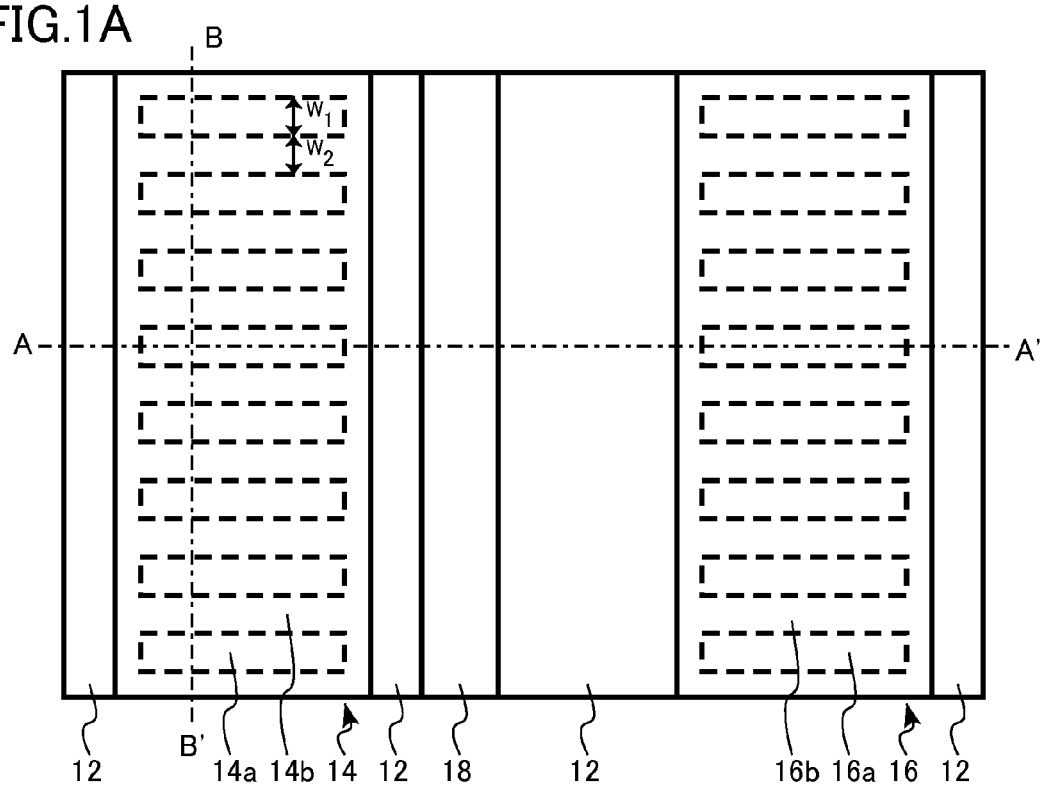
FIGS. 1A to 1C are schematic diagrams of a semiconductor device according to a first embodiment.

A semiconductor device according to an embodiment includes a first semiconductor layer, a second semiconductor layer provided on the first semiconductor layer and having a wider band gap than the first semiconductor layer, a source electrode and a drain electrode provided on the second semiconductor layer, at least one of the source electrode and the drain electrode including a plurality of protrusions on a side in contact with the second semiconductor layer, and a gate electrode provided on the second semiconductor layer between the source electrode and the drain electrode.

In this specification, the same reference numerals are attached to the same or similar members to omit duplicate descriptions.

In this specification, a "GaN based semiconductor" is a generic name for semiconductors including GaN (gallium nitride), AlN (aluminum nitride), InN (indium nitride) or semiconductors including intermediate composition thereof.

In this specification, "non-doped" is a state in which no impurity is intentionally introduced and normally, the concentration of impurity is $1\times10^{15}$ cm$^{-3}$ or less.

Also in this specification, "up" and "down" are terms showing the relative physical relationship between constituent elements and do not necessarily show a vertical relationship in the gravitational direction.

First Embodiment

A semiconductor device according to the present embodiment includes a first semiconductor layer of a GaN based semiconductor, a second semiconductor layer of the GaN based semiconductor provided on the first semiconductor layer and having a wider band gap than the first semiconductor layer, a source electrode and a drain electrode provided on the second semiconductor layer, wherein at least one of the source electrode and the drain electrode includes a plurality of protrusions on a side in contact with the second semiconductor layer, and a gate electrode provided on the second semiconductor layer between the source electrode and the drain electrode.

Figure 1B:
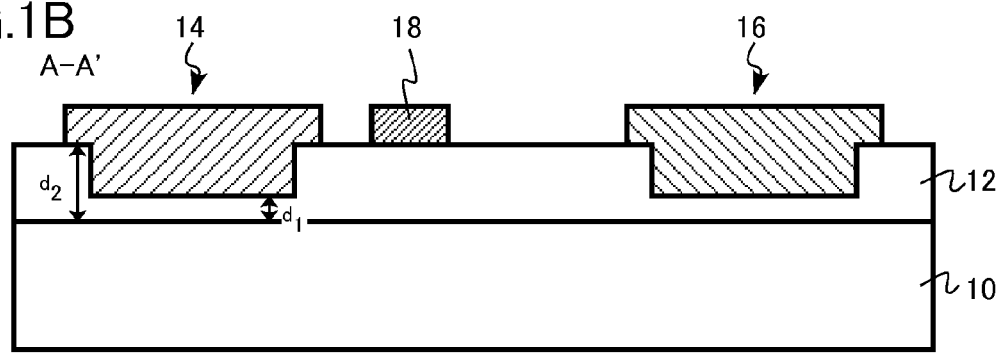
Figure 1C:
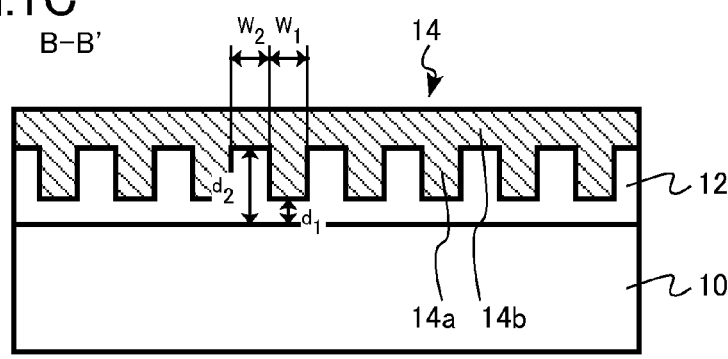

FIGS. 1A to 1C are schematic diagrams of a semiconductor device according to the present embodiment. The semiconductor device according to the present embodiment is HFET in a Schottky gate structure. FIG. 1A is a schematic plan view, FIG. 1B is an A-A' schematic sectional view of FIG. 1A, and FIG. 1C is a B-B' schematic sectional view of FIG. 1A.

As shown in FIGS. 1A to 1C, in the semiconductor device according to the present embodiment, a barrier layer (second semiconductor layer) 12 of a GaN based semiconductor having a wider band gap than a channel layer (first semiconductor layer) 10 of the GaN based semiconductor is provided on the channel layer 10. Also, a source electrode 14 and a drain electrode 16 are provided in the barrier layer (second semiconductor layer) 12. Then, a gate electrode 18 is provided on the barrier layer 12 between the source electrode 14 and the drain electrode 16.

The source electrode 14 includes a plurality of protrusions 14a on the side in contact with the barrier layer 12. The plurality of protrusions 14a is convex toward the channel layer 10.

Also, the drain electrode 16 includes a plurality of protrusions 16a on the side in contact with the barrier layer 12. The plurality of protrusions 16a is convex toward the channel layer 10.

The channel layer (first semiconductor) 10 is, for example, non-doped $Al_XGa_{1-X}N$ (0≤X<1). For example, the channel layer 10 is non-doped GaN. Incidentally, the channel layer 10 may contain an n-type or p-type impurity.

The barrier layer (second semiconductor layer) 12 is, for example, non-doped or n-type $Al_YGa_{1-Y}N$ (0<Y≤1, X<Y). The barrier layer 12 is, for example, non-doped $Al_{0.25}Ga_{0.75}N$. The barrier layer 12 has a higher aluminum (Al) concentration than the channel layer 10.

The source electrode 14 and the drain electrode 16 are metal electrodes. The source electrode 14 and the drain electrode 16 contain, for example, titanium (Ti), titanium nitride (TiN), aluminum (Al), tantalum (Ta), molybdenum (Mo), tungsten (W) or the like. The source electrode 14 and the drain electrode 16 may have a stacked structure of a plurality of metals. The contact between the source electrode 14 and the drain electrode 16, and the channel layer 10 is desirably an ohmic contact.

The plurality of protrusions 14a and the plurality of protrusions 16a each include periodicity. The plurality of protrusions 14a and the plurality of protrusions 16a are formed in a stripe shape extending in a direction from the source electrode 14 and the drain electrode 16 toward the gate electrode 18 respectively. The plurality of protrusions 14a and the plurality of protrusions 16a include periodicity.

The gate electrode 18 is, for example, a metal electrode. The gate electrode 18 is in Schottky contact with the barrier layer 12. The gate electrode 18 contains, for example, nickel (Ni), platinum (Pt), or gold (Au). The gate electrode 18 may have a stacked structure of a plurality of metals.

Next, an example of the method for fabricating a semiconductor device according to the present embodiment will be described. A support substrate (not shown), for example, a silicon (Si) substrate is prepared. Next, non-doped GaN to be the channel layer 10 and non-doped $Al_{0.25}Ga_{0.75}N$ to be the barrier layer 12 are formed by, for example, epitaxial growth on the Si substrate.

Next, the non-doped $Al_{0.25}Ga_{0.75}N$ is etched to form grooves to be the protrusions 14a, 16a later. The source electrode 14 and the drain electrode 16 are formed on the non-doped $Al_{0.25}Ga_{0.75}N$ including formed grooves by forming a metal film and patterning.

Then, the gate electrode 18 is formed on the non-doped $Al_{0.25}Ga_{0.75}N$ between the source electrode 14 and the drain electrode 16 by forming a metal film and patterning.

The semiconductor device shown in FIGS. 1A to 1C is fabricated by the method for fabrication described above.

Next, the functions and effect of a semiconductor device according to the present embodiment will be described.

In HFET according to the present embodiment, a two-dimensional electron gas (2DEG) caused by polarization of the barrier layer 12 is generated on the channel layer 10 side of an interface between the channel layer 10 and the barrier layer 12. The two-dimensional electron gas becomes a carrier of HFET.

A distance ($d_1$) between the source electrode protrusion 14a and the channel layer 10 is smaller than a distance ($d_2$) between a region 14b between the two neighboring protrusions of the source electrode and the barrier layer 12. In other words, the thickness of the barrier layer 12 between the source electrode protrusion 14a and the channel layer 10 is thinner than the barrier layer 12 between the region 14b between protrusions of the source electrode and the channel layer 10.

By making the thickness of the barrier layer 12 between the source electrode protrusion 14a and the channel layer 10 thinner, a barrier width between the source electrode 14 and the channel layer 10 becomes shorter. Therefore, compared with between the region 14b between protrusions of the source electrode 14 and the channel layer 10, tunneling of carriers is more likely to occur between the source electrode protrusion 14a and the channel layer 10. This also applies to between the drain electrode 16 and the channel layer 10.

Figure 2A:
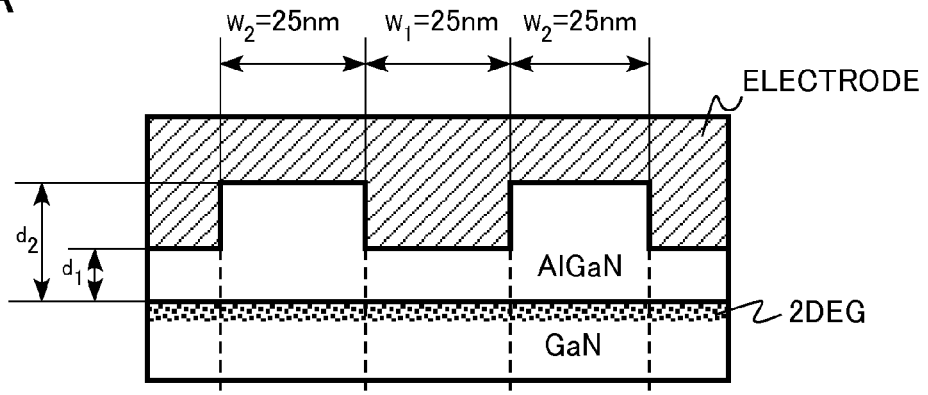
FIGS. 2A to 2C are diagrams showing functions of the semiconductor device according to the first embodiment.
Figure 2B:
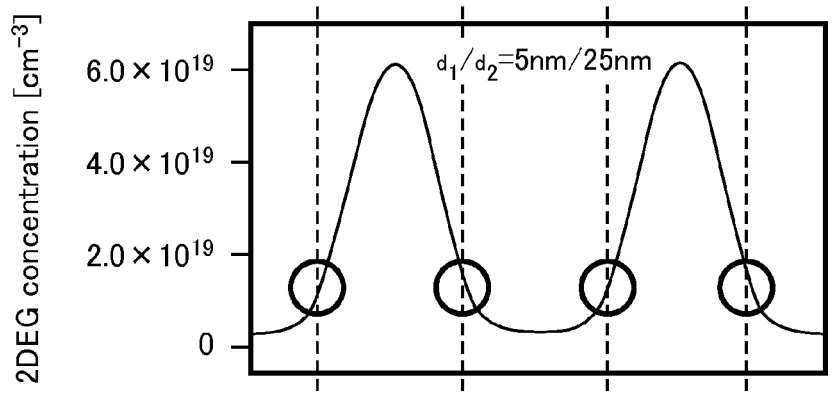
Figure 2C:
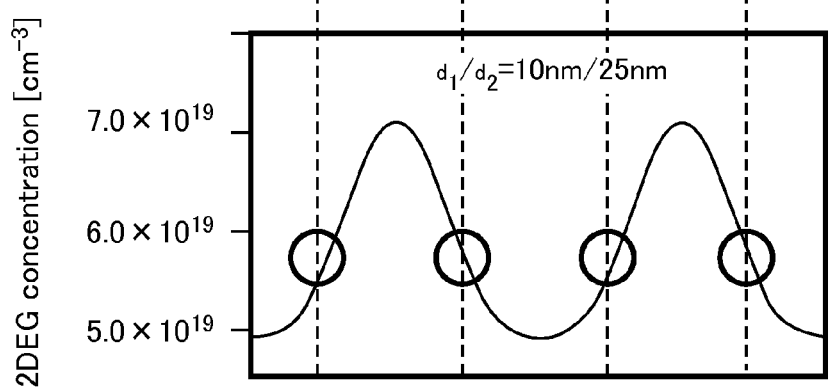

FIG. 2 is a diagram showing the functions of the semiconductor device according to the present embodiment. Simulation results of the two-dimensional electron gas (2DEG) concentration when protrusions are provided on the AlGaN side of the electrode on the stacked structure of the GaN/AlGaN are shown. FIG. 2A is a schematic sectional view of a device structure used for simulation, FIG. 2B is a diagram showing the two-dimensional electron gas concentration when $d_1/d_2$=5 nm/25 nm, and FIG. 2C is a diagram showing the two-dimensional electron gas concentration when $d_1/d_2$=10 nm/25 nm.

As is evident from FIGS. 2B and 2C, the AlGaN layer is thin below the protrusions and polarizing effect is weakened, leading to a lower concentration of the two-dimensional electron gas. Thus, even if tunneling is more likely to occur by simply making the AlGaN layer below the electrode thinner, the amount of carriers decreases and the resistance between the electrode and the GaN layer cannot be reduced.

Indeed, as is evident from FIGS. 2B and 2C, the two-dimensional electron gas concentration (circled portions in these figures) at protrusion corners of the electrode maintains a high concentration. Thus, the resistance between the electrode and the GaN layer is reduced by the flow of carriers between protrusion corners of the electrode where tunneling of carriers is likely to occur and a region of the electrode where there is no protrusion and the two-dimensional electron gas concentration is high. In other words, access resistance between the protrusion corners of the electrode and a two-dimensional electron concentration is reduced.

In the semiconductor device according to the present embodiment, from the viewpoint of making tunneling more likely to occur, the distance ($d_1$) between the source electrode protrusion 14a and the channel layer (first semiconductor layer) 10 and the distance ($d_1$) between the drain electrode protrusion 16a and the channel layer (first semiconductor layer) 10 are desirably 10 nm or less and more desirably 5 nm or less.

Also in the semiconductor device according to the present embodiment, the distance ($d_2$) between the region 14b between protrusions of the source electrode and the channel layer (first semiconductor layer) 10 and the distance ($d_2$) between a region 16b between protrusions of the drain electrode and the channel layer (first semiconductor layer) 10 are desirably 15 nm or more and more desirably 20 nm or more.

Also in the semiconductor device according to the present embodiment, the distance ($d_2$) between the region 14b between protrusions and the channel layer (first semiconductor layer) 10 is desirably twice the distance ($d_1$) between the protrusion 14a and the channel layer (first semiconductor layer) 10 or more from the viewpoint of reducing the contact resistance of the source electrode 14. Similarly, the distance ($d_2$) between the region 16b between protrusions and the channel layer (first semiconductor layer) 10 is desirably twice the distance ($d_1$) between the protrusion 16a and the channel layer (first semiconductor layer) 10 or more from the viewpoint of reducing the contact resistance of the drain electrode 16.

The distance ($d_1$) between the source electrode protrusion 14a and the channel layer 10 and the distance ($d_1$) between the drain electrode protrusion 16a and the channel layer 10 define the shortest portion from the protrusions 14a, 16a to the channel layer 10. Also, the distance ($d_2$) between the region 14b between protrusions of the source electrode and the channel layer 10 and the distance ($d_2$) between the region 16b between protrusions of the drain electrode and the channel layer 10 define the shortest portion from the regions 14b, 16b between protrusions to the channel layer 10. For example, a plurality of locations on an image captured by a transmission electron microscope (TEM) may be measured for each case to set an average value of measurements as a representative value of the semiconductor device.

FIGS. 3, 4A to 4E, and 5 are diagrams showing effects of the semiconductor device according to the present embodiment. Measurement results of the contact resistance when protrusions are provided on the semiconductor layer side of electrode are shown. In this specification, the contact including contact of a two-dimensional electron gas (2DEG) below the electrode is called the contact resistance.

Figure 3:
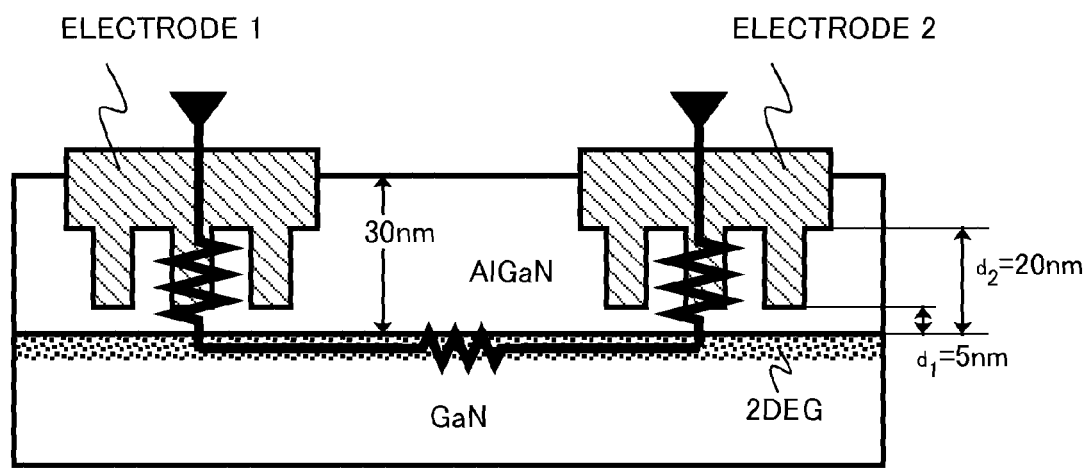
FIG. 3 is a diagram showing an effect of the semiconductor device according to the first embodiment.

FIG. 3 is a schematic sectional view of a device structure used for measurement. FIGS. 4A to 4E are schematic diagrams showing patterns of protrusions of electrode used for measurement. FIG. 5 is a diagram showing the relationship between the contact resistance and the pattern of protrusions shown in FIGS. 4A to 4E.

As shown in FIG. 3, two electrodes (an electrode 1 and an electrode 2) are formed on a stacked structure of GaN/AlGaN and the resistance between the two electrodes is measured. The TLM (Transfer Length Method) that determines the contact resistance between the electrode and the GaN layer by measuring resistance in device structures in which the distance between two electrodes is changed is used.

The contact resistance of electrodes is evaluated by using different patterns of protrusions as shown in FIGS. 4A to 4E. In FIGS. 4A to 4E, hatched regions surrounded by a broken line show plane shapes of protrusions.

A stacked structure of titanium nitride (TiN) and titanium silicide ($TiSi_2$) is used for the electrode. The size of the electrode is set to 80 μm×140 μm. The thickness of the AlGaN layer is set to 30 nm and also $d_1/d_2$=5 nm/20 nm and $W_1/W_2$=5 μm/5 μm are set.

Figure 4A:
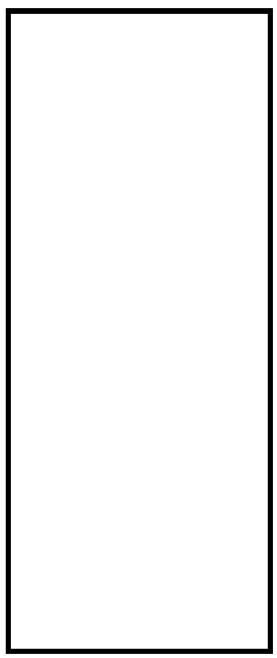
FIGS. 4A to 4E are diagrams showing the effect of the semiconductor device according to the first embodiment.
Figure 4B:
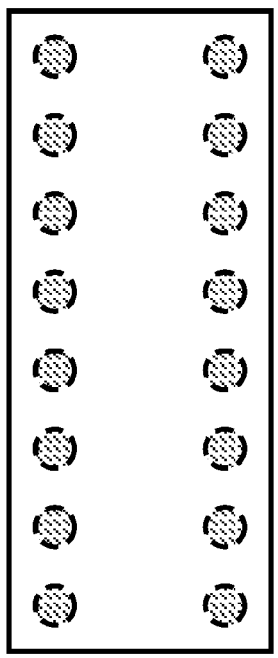
Figure 4C:
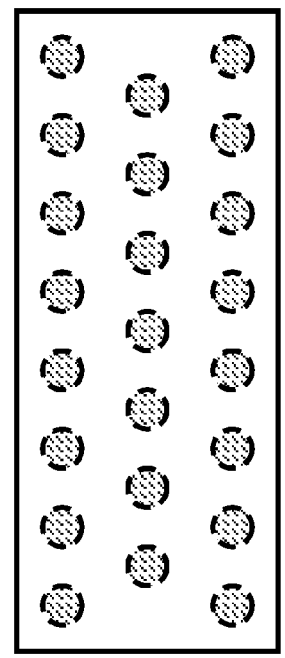
Figure 4D:
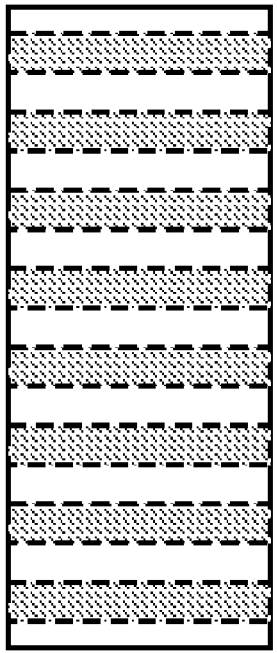
Figure 4E:
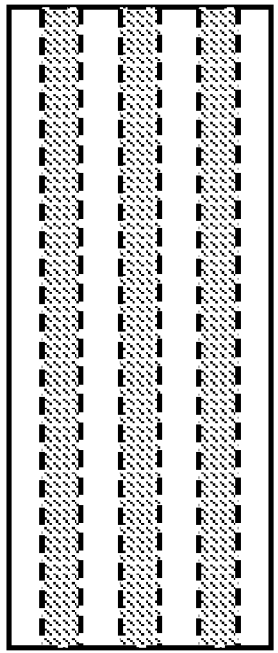
Figure 5:
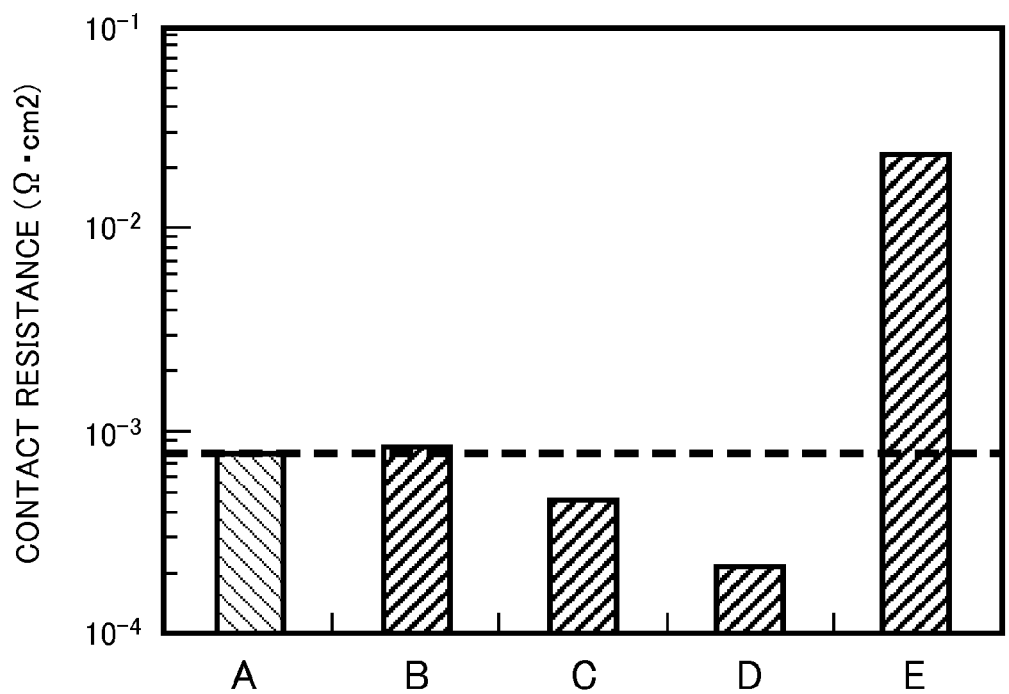
FIG. 5 is a diagram showing the effect of the semiconductor device according to the first embodiment.

FIG. 4A shows a pattern without protrusions, FIG. 4B shows a dotted pattern of protrusions, FIG. 4C shows an offset dotted pattern of protrusions, FIG. 4D shows a striped pattern in which protrusions extend in a direction toward the opposed electrode, and FIG. 4E shows a striped pattern in which protrusions extend in a direction orthogonal to the direction toward the opposed electrode.

As shown in FIG. 5, in the patterns of C and D, particularly in the pattern of D, the contact resistance becomes equal to or less than the half of the contact resistance of the pattern without protrusions and a remarkable decrease of the contact resistance is confirmed. The reason for a remarkable decrease of the contact resistance in the pattern of D is considered that the AlGaN layer is thick and a region of a high two-dimensional electron gas concentration extends in the direction in which carriers travel. On the other hand, an increase of the contact resistance is observed in the pattern of E in which protrusions are provided in a direction orthogonal to the direction in which carriers travel.

In the present embodiment, a decrease of the contact resistance due to an increased contact area by providing protrusions on the side of the electrode in contact with the semiconductor layer can also be expected. Among samples prototyped this time, in the pattern of, for example, D, a contact area increased by providing protrusions is only 0.3%. It is clear therefore that a decrease of the contact resistance according to the present embodiment is not caused exclusively by an increased contact area.

As is evident from the above measurement results of the contact resistance, being a striped shape in which the plurality of protrusions 14a extends in a direction from the source electrode 14 toward the gate electrode 18 is desirable from the viewpoint of reducing the contact resistance. Similarly, being a striped shape in which the plurality of protrusions 16a extends in a direction from the drain electrode 16 toward the gate electrode 18 is desirable from the viewpoint of reducing the contact resistance.

The plurality of protrusions 14a and the plurality of protrusions 16a desirably include periodicity. By including periodicity, an extreme deviation of the contact resistance of the source electrode 14 and the drain electrode 16 is prevented from being generated. Thus, the current density in the source electrode 14 and the drain electrode 16 is made uniform. Therefore, extreme concentration of power is not generated and reliability of semiconductor devices is improved.

According to the present embodiment, as described above, even if the resistance of an interface between metallic materials of the source electrode and drain electrode and the semiconductor layer cannot be sufficiently reduced, a semiconductor device capable of reducing the contact resistance of the source electrode and drain electrode can be provided. Therefore, a semiconductor device in which on resistance is reduced is realized.

Second Embodiment

A semiconductor device according to the present embodiment is the same as in the first embodiment except that the ratio of protrusions provided on the side in contact with the barrier layer of the source electrode or drain electrode occupying on the side in contact with the barrier layer of the source electrode or drain electrode decreases from the source or drain electrode toward the gate electrode. Thus, the description of content overlapping with content in the first embodiment is omitted.

Figure 6:
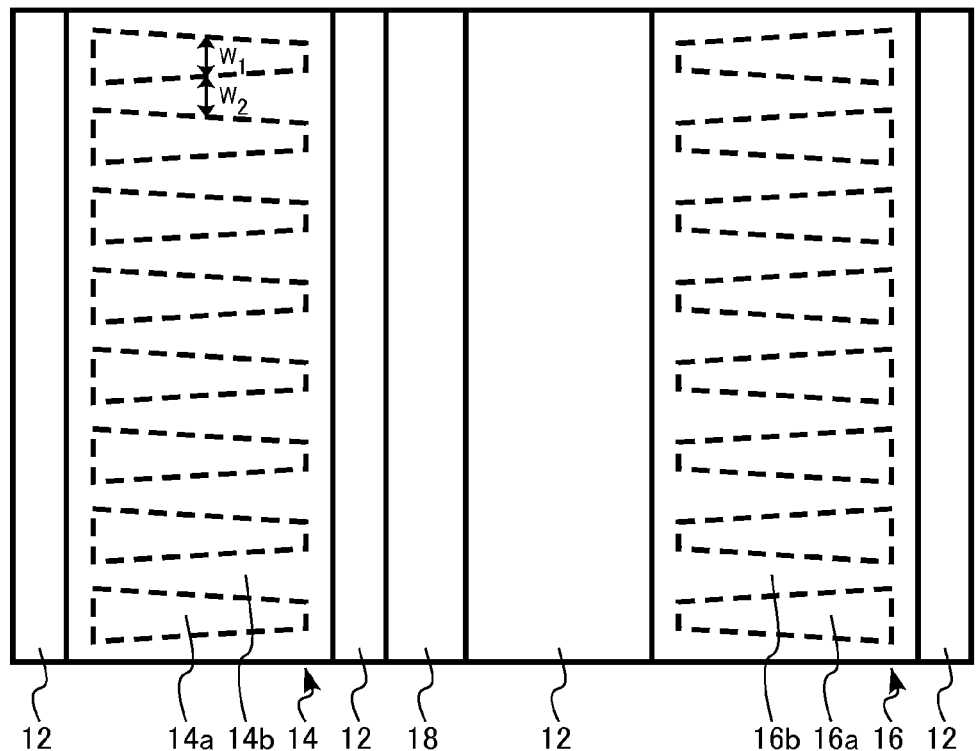
FIG. 6 is a schematic plan view of a semiconductor device according to a second embodiment.

FIG. 6 is a schematic plan view of the semiconductor device according to the present embodiment. FIG. 6 is a diagram corresponding to FIG. 1A in the first embodiment.

As shown in FIG. 6, the plurality of protrusions 14a provided in the source electrode 14 is in a striped shape in which a width ($W_1$) becomes narrower from the source electrode 14 toward the gate electrode 18. Thus, the ratio of the protrusion 14a provided on the side in contact with the barrier layer 12 of the source electrode 14 occupying on the side in contact with the barrier layer 12 of the source electrode 14 decreases from the source electrode 14 toward the gate electrode 18. The ratio of the protrusion 14a occupying on the side in contact with the barrier layer 12 of the source electrode 14 means, in a unit area when the source electrode 14 is viewed two-dimensionally, the ratio of the total area viewed two-dimensionally of the protrusion 14a contained in the unit area.

Also, the plurality of protrusions 16a provided in the drain electrode 16 is in a striped shape in which the width ($W_1$) becomes narrower from the drain electrode 16 toward the gate electrode 18. Thus, the ratio of the protrusion 16a provided on the side in contact with the barrier layer 12 of the drain electrode 16 occupying on the side in contact with the barrier layer 12 of the drain electrode 16 decreases from the drain electrode 16 toward the gate electrode 18. The ratio of the protrusion 16a occupying on the side in contact with the barrier layer 12 of the drain electrode 16 means, in a unit area when the drain electrode 16 is viewed two-dimensionally, the ratio of the total area viewed two-dimensionally of the protrusion 16a contained in the unit area.

According to the present embodiment, the ratio of regions where the barrier layer (second semiconductor layer) 12 is thin below the source electrode 14 and the drain electrode 16 decreases in a direction toward the gate electrode 18. In other words, the ratio of regions where the two-dimensional electron gas concentration is low and the resistance is high decreases in a direction toward the gate electrode 18. Therefore, compared with the first embodiment, the contact resistance of the source electrode 14 and the drain electrode 16 is further reduced.

Third Embodiment

A semiconductor device according to the present embodiment is the same as in the second embodiment except that the pattern of protrusions is different.

Figure 7:
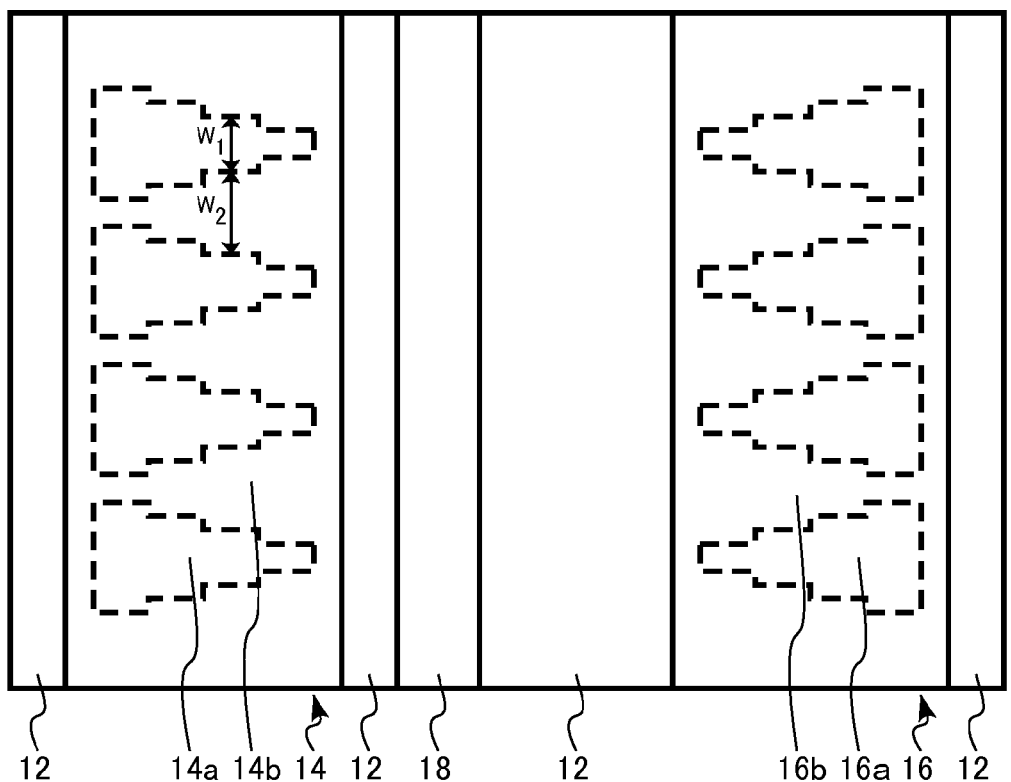
FIG. 7 is a schematic plan view of a semiconductor device according to a third embodiment.

FIG. 7 is a schematic plan view of the semiconductor device according to the present embodiment. FIG. 7 is a diagram corresponding to FIG. 1A in the first embodiment.

As shown in FIG. 7, the plurality of protrusions 14a provided in the source electrode 14 is in a stepped shape in which the width ($W_1$) becomes narrower from the source electrode 14 toward the gate electrode 18. Thus, the ratio of the protrusion 14a provided on the side in contact with the barrier layer 12 of the source electrode 14 occupying on the side in contact with the barrier layer 12 of the source electrode 14 decreases from the source electrode 14 toward the gate electrode 18.

Also, the plurality of protrusions 16a provided in the drain electrode 16 is in a stepped shape in which the width ($W_1$) becomes narrower from the drain electrode 16 toward the gate electrode 18. Thus, the ratio of the protrusion 16a provided on the side in contact with the barrier layer 12 of the drain electrode 16 occupying on the side in contact with the barrier layer 12 of the drain electrode 16 decreases from the drain electrode 16 toward the gate electrode 18.

According to the present embodiment, like in the second embodiment, the ratio of regions where the barrier layer (second semiconductor layer) 12 is thin below the source electrode 14 and the drain electrode 16 decreases in a direction toward the gate electrode 18. In other words, the ratio of regions where the two-dimensional electron gas concentration is low and the resistance is high decreases in a direction toward the gate electrode 18. Therefore, compared with the first embodiment, the contact resistance of the source electrode 14 and the drain electrode 16 is further reduced.

Fourth Embodiment

A semiconductor device according to the present embodiment is the same as in the first embodiment except that the width of protrusions becomes narrower from the source electrode or drain electrode toward the first semiconductor layer. Thus, the description of content overlapping with content in the first embodiment is omitted.

Figure 8:
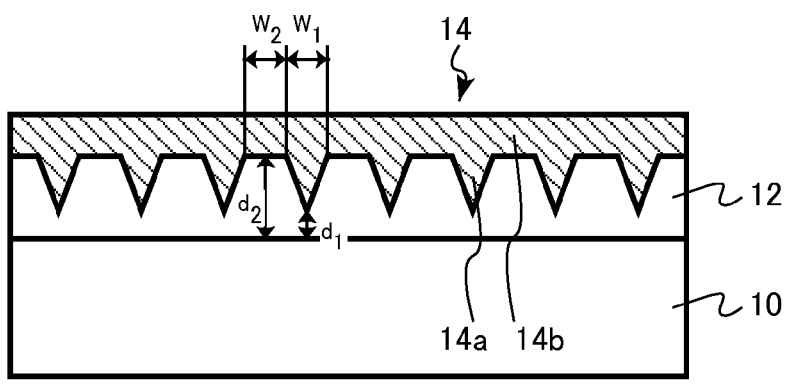
FIG. 8 is a schematic sectional view of a semiconductor device according to a fourth embodiment.

FIG. 8 is a schematic sectional view of the semiconductor device according to the present embodiment. FIG. 8 is a diagram corresponding to FIG. 1C in the first embodiment.

As shown in FIG. 8, the plurality of protrusions 14a provided in the source electrode 14 has a triangular sectional shape. Thus, the width ($W_1$) of the plurality of protrusions 14a provided in the source electrode 14 becomes narrower in a direction toward the channel layer (first semiconductor layer) 12.

Though not illustrated, the plurality of protrusions 16a provided in the drain electrode 16 also has a triangular sectional shape. Therefore, the width ($W_1$) of the plurality of protrusions 16a provided in the drain electrode 16 also becomes narrower in a direction toward the channel layer (first semiconductor layer) 12.

The shape of protrusions in the present embodiment can be fabricated by, for example, forming a mask material of etching in a tapered shape or lowering a selection ratio of the mask material of etching to the barrier layer when grooves to form protrusions are formed in the barrier layer by etching.

According to the present embodiment, like in the first embodiment, the contact resistance of the source electrode 14 and the drain electrode 16 is reduced. Then, with a decrease of the ratio of regions where the two-dimensional electron gas concentration is low and the resistance is high, compared with the first embodiment, the contact resistance of the source electrode 14 and the drain electrode 16 is further reduced.

Fifth Embodiment

A semiconductor device according to the present embodiment is the same as in the fourth embodiment except that the cross section of protrusions is wedge-shaped.

Figure 9:
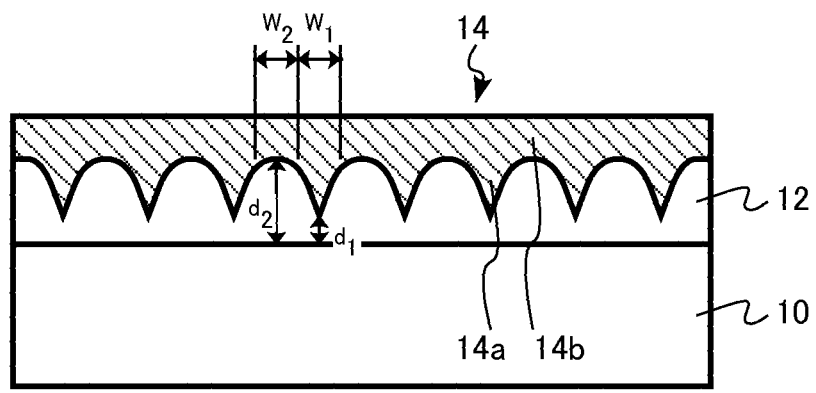
FIG. 9 is a schematic sectional view of a semiconductor device according to a fifth embodiment.

FIG. 9 is a schematic sectional view of the semiconductor device according to the present embodiment. FIG. 9 is a diagram corresponding to FIG. 1C in the first embodiment.

As shown in FIG. 9, the plurality of protrusions 14a provided in the source electrode 14 has a wedge sectional shape. Thus, the width ($W_1$) of the plurality of protrusions 14a provided in the source electrode 14 becomes narrower in a direction toward the channel layer (first semiconductor layer) 12.

Though not illustrated, the plurality of protrusions 16a provided in the drain electrode 16 also has a wedge sectional shape. Therefore, the width ($W_1$) of the plurality of protrusions 16a provided in the drain electrode 16 also becomes narrower in a direction toward the channel layer (first semiconductor layer) 12.

The shape of protrusions in the present embodiment can be fabricated by, for example, forming a mask material of etching in a tapered shape or lowering a selection ratio of the mask material of etching to the barrier layer when grooves to form protrusions are formed in the barrier layer by etching.

According to the present embodiment, like in the first embodiment, the contact resistance of the source electrode 14 and the drain electrode 16 is reduced. Then, with a decrease of the ratio of regions where the two-dimensional electron gas concentration is low and the resistance is high, compared with the first embodiment, the contact resistance of the source electrode 14 and the drain electrode 16 is further reduced.

Sixth Embodiment

A semiconductor device according to the present embodiment is the same as in the first embodiment except that the width of protrusions is narrower than an interval between two neighboring protrusions. Thus, the description of content overlapping with content in the first embodiment is omitted.

Figure 10:
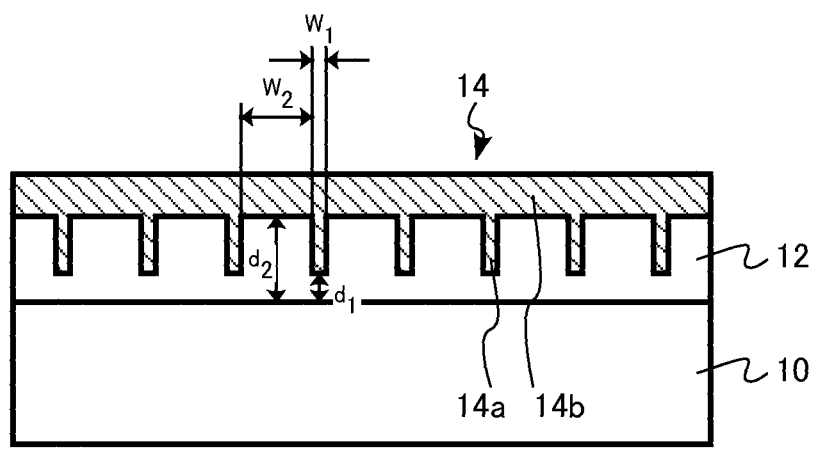
FIG. 10 is a schematic sectional view of a semiconductor device according to a sixth embodiment.

FIG. 10 is a schematic sectional view of the semiconductor device according to the present embodiment. FIG. 10 is a diagram corresponding to FIG. 1C in the first embodiment.

As shown in FIG. 10, the width ($W_1$) of the protrusion 14a provided in the source electrode 14 is narrower than an interval ($W_2$) of the two neighboring protrusions 14a. Though not illustrated, the width ($W_1$) of the protrusion 16a provided in the drain electrode 16 is also narrower than the interval ($W_2$) of the two neighboring protrusions 16a.

According to the present embodiment, like in the first embodiment, the contact resistance of the source electrode 14 and the drain electrode 16 is reduced. Then, with a decrease of the ratio of regions where the two-dimensional electron gas concentration is low and the resistance is high, compared with the first embodiment, the contact resistance of the source electrode 14 and the drain electrode 16 is further reduced.

Seventh Embodiment

A semiconductor device according to the present embodiment is the same as in the first embodiment except that a plurality of protrusions has periodicity and the period of protrusions is 100 times or more of the distance between a region between two neighboring protrusions and the first semiconductor layer. Thus, the description of content overlapping with content in the first embodiment is omitted.

The period of protrusions is a period of protrusions being disposed and corresponds to, for example, in FIG. 1C in the first embodiment, the value of $W_1+W_2$. Thus, if described with reference to FIG. 1C, in the present embodiment, the period ($W_1+W_2$) of protrusions is 100 times or more of the distance ($d_2$) between the region 14b between protrusions and the channel layer (first semiconductor layer) 10.

The width ($W_1$) of protrusions and the interval ($W_2$) between two neighboring protrusions may be determined by measuring a plurality of locations on an image captured by a transmission electron microscope (TEM) for each case and setting respective average values as representative values of the semiconductor device.

In the pattern of FIG. 4D, for example, the period ($W_1+W_2$) of protrusions is 10 μm and the distance ($d_2$) between the region 14b between protrusions and the channel layer (first semiconductor layer) 10 is 20 nm. Therefore, the period of protrusions is 500 times the distance between the region between protrusions and the first semiconductor layer.

According to the present embodiment, like in the first embodiment, the contact resistance of the source electrode 14 and the drain electrode 16 is reduced. Then, with the period of protrusions being relaxed, it becomes easier to form a pattern of protrusions.

Eighth Embodiment

A semiconductor device according to the present embodiment is the same as in the first embodiment except that a plurality of protrusions has a dotted shape with an offset. Thus, the description of content overlapping with content in the first embodiment is omitted.

Figure 11:
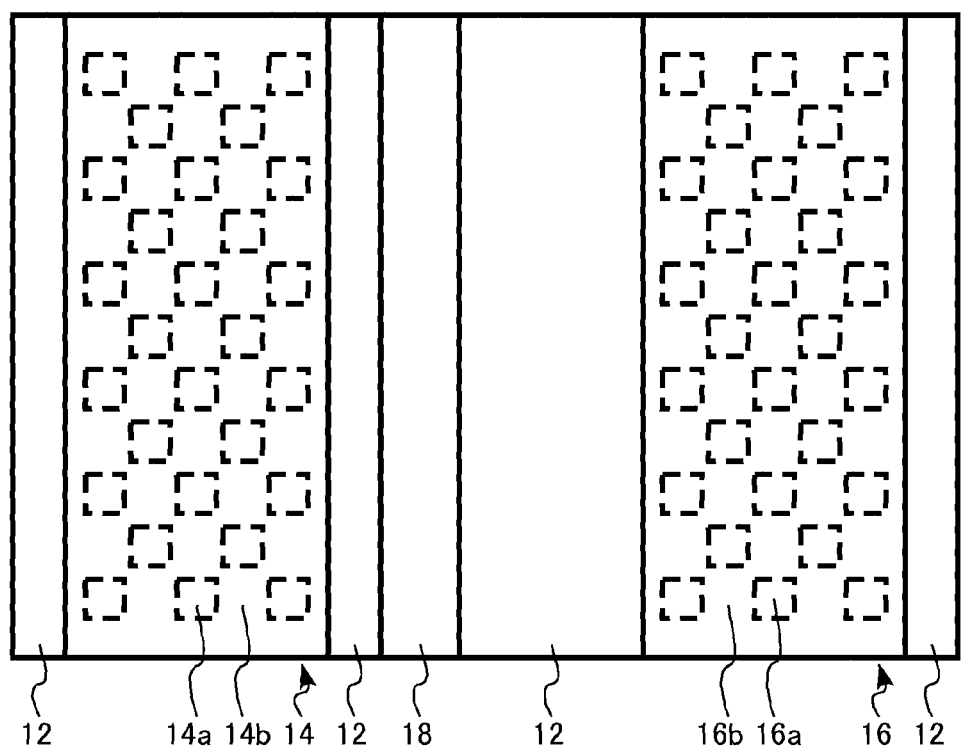
FIG. 11 is a schematic plan view of a semiconductor device according to an eighth embodiment.

FIG. 11 is a schematic plan view of the semiconductor device according to the present embodiment. FIG. 11 is a diagram corresponding to FIG. 1A in the first embodiment.

As shown in FIG. 11, the protrusions 14a, 16a provided in the source electrode 14 and the drain electrode 16 have a dotted shape with an offset respectively.

According to the present embodiment, like in the first embodiment, the contact resistance of the source electrode 14 and the drain electrode 16 is reduced.

Ninth Embodiment

A semiconductor device according to the present embodiment is the same as in the eighth embodiment except that the ratio of protrusions provided on the side in contact with the second semiconductor layer of the source electrode or drain electrode occupying on the side in contact with the second semiconductor layer of the source electrode or drain electrode decreases from the source electrode or drain electrode toward the gate electrode.

Figure 12:
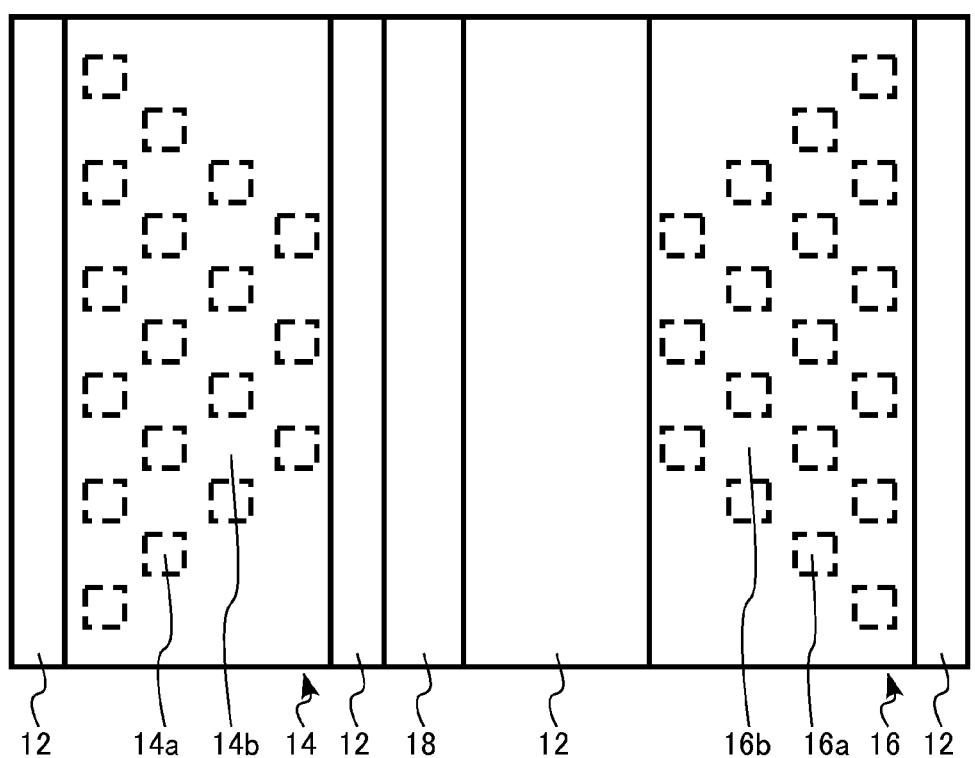
FIG. 12 is a schematic plan view of a semiconductor device according to a ninth embodiment.

FIG. 12 is a schematic plan view of the semiconductor device according to the present embodiment. FIG. 12 is a diagram corresponding to FIG. 1A in the first embodiment.

As shown in FIG. 12, the protrusions 14a provided in the source electrode 14 have a dotted shape with an offset. Then, the number of the protrusions 14a in a dotted shape provided in the source electrode 14 decreases from the source electrode 14 toward the gate electrode 18. Thus, the ratio of the protrusion 14a provided on the side in contact with the barrier layer 12 of the source electrode 14 occupying on the side in contact with the barrier layer 12 of the source electrode 14 decreases from the source electrode 14 toward the gate electrode 18.

Also, the protrusions 16a provided in the drain electrode 16 have a dotted shape with an offset. Then, the number of the protrusions 16a in a dotted shape provided in the drain electrode 16 decreases from the drain electrode 16 toward the gate electrode 18. Thus, the ratio of the protrusion 16a provided on the side in contact with the barrier layer 12 of the drain electrode 16 occupying on the side in contact with the barrier layer 12 of the drain electrode 16 decreases from the drain electrode 16 toward the gate electrode 18.

According to the present embodiment, the ratio of regions where the barrier layer (second semiconductor layer) 12 is thin below the source electrode 14 and the drain electrode 16 decreases in a direction toward the gate electrode 18. In other words, the ratio of regions where the two-dimensional electron gas concentration is low and the resistance is high decreases in a direction toward the gate electrode 18. Therefore, compared with the eighth embodiment, the contact resistance of the source electrode 14 and the drain electrode 16 is further reduced.

Tenth Embodiment

A semiconductor device according to the present embodiment is the same as in the first embodiment except that a plurality of protrusions has a striped shape extending in a direction orthogonal to the direction from the source electrode or drain electrode toward the gate electrode. Thus, the description of content overlapping with content in the first embodiment is omitted.

Figure 13:
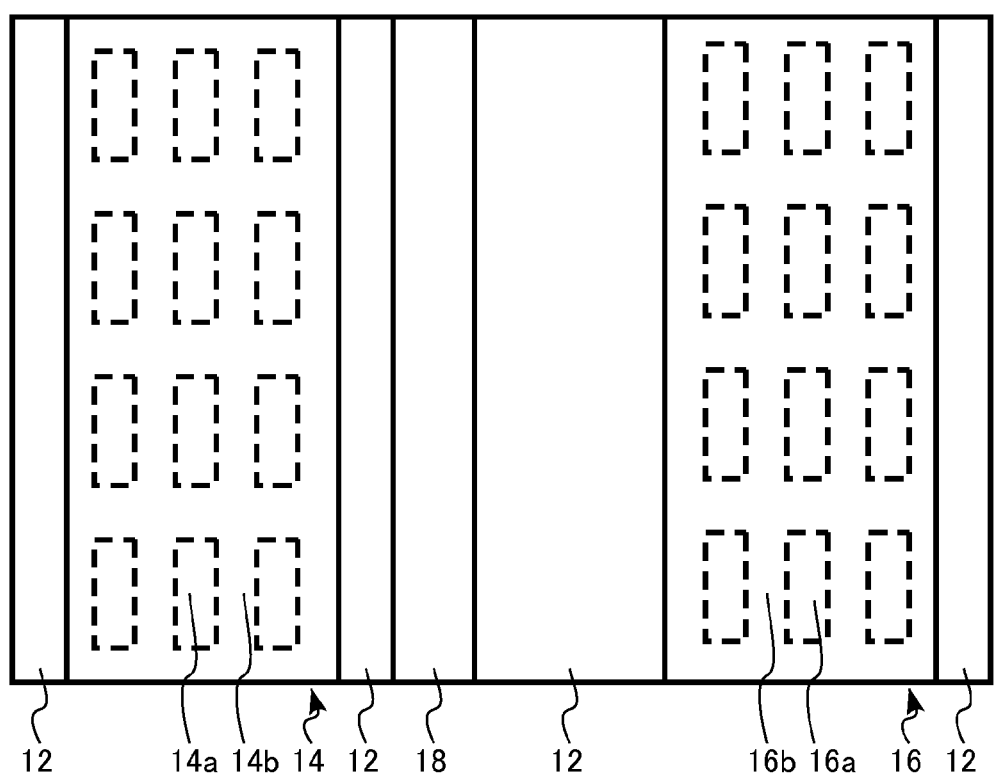
FIG. 13 is a schematic plan view of a semiconductor device according to a tenth embodiment.

FIG. 13 is a schematic plan view of the semiconductor device according to the present embodiment. FIG. 13 is a diagram corresponding to FIG. 1A in the first embodiment.

As shown in FIG. 13, the protrusions 14a, 16a provided in the source electrode 14 and the drain electrode 16 have a striped shape extending in a direction orthogonal to the direction from the source electrode 14 and the drain electrode 16 toward the gate electrode 18 respectively. The protrusions 14a, 16a are disposed intermittently in a direction orthogonal to the direction from the source electrode 14 and the drain electrode 16 toward the gate electrode 18 respectively. The plurality of protrusions 14a and the plurality of protrusions 16a include periodicity.

According to the present embodiment, like in the first embodiment, the contact resistance of the source electrode 14 and the drain electrode 16 is reduced. Particularly, the plurality of protrusions 14a and the plurality of protrusions 16a are disposed intermittently in a direction orthogonal to the direction from the source electrode 14 and the drain electrode 16 toward the gate electrode 18 respectively. Therefore, regions with a high two-dimensional electron gas concentration are linked on a direction from the source electrode 14 or the drain electrode 16 toward the gate electrode 18 to inhibit the resistance of the two-dimensional electron gas from rising.

Eleventh Embodiment

A semiconductor device according to the present embodiment is the same as in the first embodiment except that the cross section of the source electrode and the drain electrode is stepwise. Thus, the description of content overlapping with content in the first embodiment is omitted.

Figure 14:
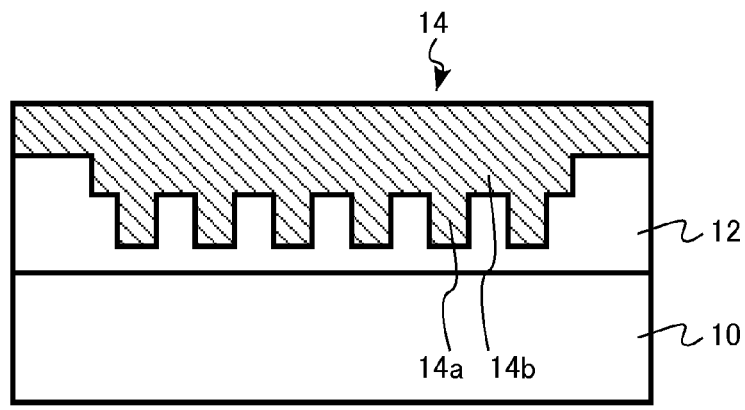
FIG. 14 is a schematic sectional view of a semiconductor device according to an eleventh embodiment.

FIG. 14 is a schematic sectional view of the semiconductor device according to the present embodiment. FIG. 14 is a diagram corresponding to FIG. 1C in the first embodiment.

As shown in FIG. 14, the cross section of the source electrode 14 is stepwise. Though not illustrated, the cross section of the drain electrode 16 is also stepwise.

According to the present embodiment, like in the first embodiment, the contact resistance of the source electrode 14 and the drain electrode 16 is reduced.

Twelfth Embodiment

A semiconductor device according to the present embodiment is the same as in the first embodiment except that a tensile stress is generated in the second semiconductor layer between the source electrode or drain electrode having protrusions and the first semiconductor layer. Thus, the description of content overlapping with content in the first embodiment is omitted.

In the present embodiment, for example, a tensile stress is generated in the barrier layer (second semiconductor layer) 12 between the source electrode 14 including the protrusions 14a shown in FIG. 1 and the channel layer (first semiconductor layer) 10. Similarly, a tensile stress is also generated in the barrier layer (second semiconductor layer) 12 between the drain electrode 16 including the protrusions 16a and the channel layer (first semiconductor layer) 10.

As the material of the source electrode 14 or the drain electrode 16, for example, a material that generates a tensile stress in the barrier layer 12 is selected. If the barrier layer 12 is, for example, AlGaN, a tensile stress can be generated in the barrier layer 12 by selecting tungsten (W) or copper (Cu) as the material of the source electrode 14 or the drain electrode 16. Also, if the barrier layer 12 is, for example, AlGaN, a tensile stress can be generated in the barrier layer 12 by forming titanium (Ti) and aluminum (Al) on the barrier layer 12 and then filling grooves to form protrusions with tungsten (W).

According to the present embodiment, like in the first embodiment, the contact resistance of the source electrode 14 and the drain electrode 16 is reduced. In addition, with a tensile stress being generated in the barrier layer 12, the polarization of the barrier layer 12 increases, leading to a higher two-dimensional electron gas concentration below the source electrode 14 and the drain electrode 16. Therefore, compared with the first embodiment, the contact resistance of the source electrode 14 and the drain electrode 16 is further reduced.

Thirteenth Embodiment

A semiconductor device according to the present embodiment is the same as in the first embodiment except that a gate insulating film is further included between the second semiconductor layer and the gate electrode. Thus, the description of content overlapping with content in the first embodiment is omitted.

Figure 15:
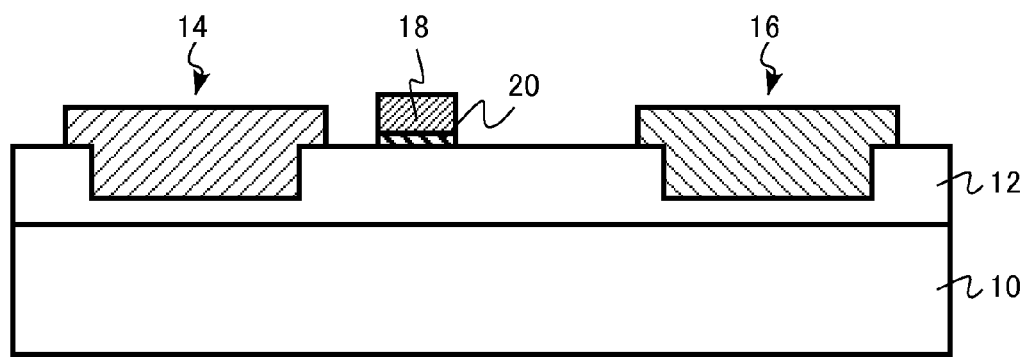
FIG. 15 is a schematic sectional view of a semiconductor device according to a thirteenth embodiment.

FIG. 15 is a schematic sectional view of the semiconductor device according to the present embodiment. FIG. 15 is a diagram corresponding to FIG. 1B in the first embodiment. The semiconductor device according to the present embodiment is HFET in an MIS (Metal Insulator Semiconductor) gate structure.

As shown in FIG. 15, the semiconductor device according to the present embodiment includes a gate insulating film 20 between the barrier layer (second semiconductor layer) 12 and the gate electrode 18. The gate insulating film 20 is, for example, silicon nitride (SiN), silicon oxide ($SiO_2$), or aluminum oxide ($Al_2O_3$).

According to the present embodiment, like in the first embodiment, the contact resistance of the source electrode 14 and the drain electrode 16 is reduced. Also, by including the gate insulating film 20, HFET can more easily be made normally off.

Fourteenth Embodiment

A semiconductor device according to the present embodiment is the same as in the first embodiment except that the gate electrode is provided inside the first semiconductor layer and the second semiconductor layer and the gate insulating film is further included between the gate electrode and the first semiconductor layer or the second semiconductor layer. In other words, a semiconductor device according to the present embodiment is the same as in the first embodiment except that the gate insulating film and the gate electrode are provided inside a trench reaching the first semiconductor layer by passing through the second semiconductor layer. Thus, the description of content overlapping with content in the first embodiment is omitted.

Figure 16:
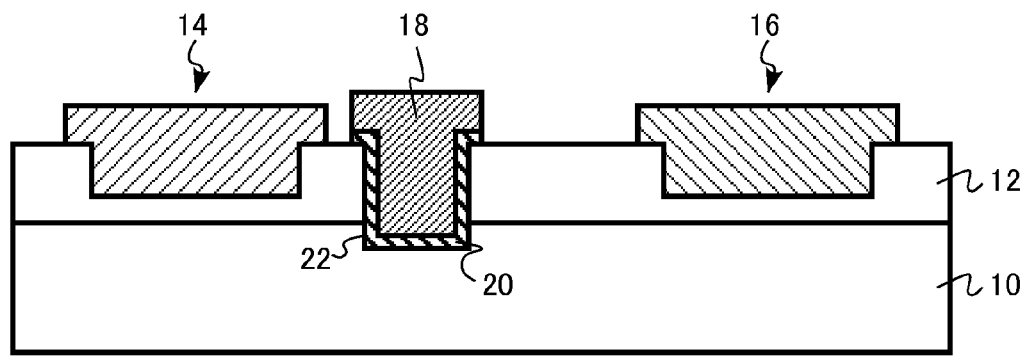
FIG. 16 is a schematic sectional view of a semiconductor device according to a fourteenth embodiment.

FIG. 16 is a schematic sectional view of the semiconductor device according to the present embodiment. FIG. 16 is a diagram corresponding to FIG. 1B in the first embodiment. The semiconductor device according to the present embodiment is MISFET (Metal Insulator Semiconductor Field Effect Transistor).

As shown in FIG. 16, the gate insulating film 20 and the gate electrode 18 are provided inside a trench 22 provided so as to reach the channel layer (first semiconductor layer) 10 by passing through the barrier layer (second semiconductor layer) 12. The gate insulating film 20 is, for example, silicon nitride (SiN), silicon oxide ($SiO_2$), or aluminum oxide ($Al_2O_3$).

According to the present embodiment, like in the first embodiment, the contact resistance of the source electrode 14 and the drain electrode 16 is reduced. The semiconductor device is MISFET and so can more easily be made normally off.

A case in which protrusions are provided on the side in contact with the barrier layer of both of the source electrode and the drain electrode are taken as an example in the embodiments, but a structure in which protrusions are provided on the side in contact with the barrier layer of only one of the source electrode and the drain electrode may also be adopted.

A case in which GaN or AlGaN is used as the material of the semiconductor layer is taken as an example in the embodiments, but for example, InGaN, InAlN, or InAlGaN containing indium (In) may also be applied. In addition, AlN may also be applied as the material of the semiconductor layer.

A case in which non-doped AlGaN is used as the barrier layer is taken as an example in the embodiments, but n-type AlGaN may also be applied.

A case in which a silicon (Si) substrate is used for the support substrate of the channel layer and the barrier layer is taken as an example in the embodiments, but in addition to the Si substrate, an SiC substrate or a GaN substrate may also be applied as the support substrate. Also, a structure in which a buffer layer to relax lattice strain is inserted between the support substrate and the channel layer may also be adopted.

Cases of the Schottky gate structure and the MIS gate structure are taken as examples in the embodiments, but other gate structures, for example, a gate structure in which a p-type GaN cap layer is included between the barrier layer of AlGaN and the gate electrode may also be applied.

A case in which protrusions include periodicity is taken as an example in the embodiments, but a random structure in which protrusions include no periodicity may also be adopted.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a first semiconductor layer;
a second semiconductor layer provided on the first semiconductor layer and having a wider band gap than the first semiconductor layer;
a source electrode and a drain electrode provided on the second semiconductor layer, at least one of the source electrode and the drain electrode including a plurality of protrusions on a side in contact with the second semiconductor layer and;
a gate electrode provided between the source electrode and the drain electrode,
wherein
the plurality of protrusions in a plan view having a striped shape and in a sectional view extending in a direction from the source electrode or the drain electrode toward the gate electrode, and
a width of the plurality of protrusions is narrower than an interval between two neighboring protrusions.

2. The device according to claim 1, wherein the first semiconductor layer and the second first semiconductor layer are a GaN based semiconductor.

3. The device according to claim 1, wherein the first semiconductor layer is $Al_XGa_{1-X}N$ ($0 \leq X < 1$) and the second semiconductor layer is non-doped or n-type $Al_YGa_{1-Y}N$ ($0 < Y \leq 1$, $X < Y$).

4. The device according to claim 1, wherein the plurality of protrusions have periodicity.

5. The device according to claim 1, wherein the striped shape of the plurality of protrusions comprises at least the two neighboring protrusions having a parallel arrangement.

6. The device according to claim 1, wherein a distance between the plurality of protrusions and the first semiconductor layer is 10 nm or less.

7. The device according to claim 1, wherein a distance between a region between the two neighboring protrusions and the first semiconductor layer is 15 nm or more.

8. The device according to claim 1, wherein a distance between a region between the two neighboring protrusions and the first semiconductor layer is twice a distance between the plurality of protrusions and the first semiconductor layer or more.

9. The device according to claim 4, wherein a period of the plurality of protrusions is 100 times a distance between a region between the two neighboring protrusions and the first semiconductor layer or more.

10. The device according to claim 1, wherein a tensile stress is generated in the second semiconductor layer between the source electrode or the drain electrode having the plurality of protrusions and the first semiconductor layer.

11. The device according to claim 1, wherein the gate electrode is provided on the second semiconductor layer.

12. The device according to claim 1, wherein the gate electrode is provided on the second semiconductor layer, further comprising: a gate insulating film provided between the second semiconductor layer and the gate electrode.

13. The device according to claim 1, wherein the gate electrode is provided inside the first semiconductor layer and the second semiconductor layer, further comprising: a gate insulating film provided between the gate electrode, and the first semiconductor layer and the second semiconductor layer.

14. The device according to claim 1, wherein the source electrode and the drain electrode contain titanium (Ti), titanium nitride (TiN), aluminum (Al), tantalum (Ta), molybdenum (Mo), or tungsten (W).

15. The device according to claim 1, wherein the gate electrode contains nickel (Ni), platinum (Pt), or gold (Au).

16. The device according to claim 1, wherein both side edges of a source electrode and both side edges of a drain electrode are provided in the second semiconductor layer.

17. A semiconductor device comprising:
a first semiconductor layer;
a second semiconductor layer provided on the first semiconductor layer and having a larger band gap than the first semiconductor layer;
a source electrode and a drain electrode provided on the second semiconductor layer, at least one of the source electrode and the drain electrode including a plurality of protrusions on a side in contact with the second semiconductor layer and;
a gate electrode provided between the source electrode and the drain electrode,
wherein
a ratio of the plurality of protrusions occupying on the side of the source electrode or the drain electrode in contact with the second semiconductor layer decreases toward the gate electrode.

18. A semiconductor device comprising:
a first semiconductor layer;
a second semiconductor layer provided on the first semiconductor layer and having a larger band gap than the first semiconductor layer;
a source electrode and a drain electrode provided on the second semiconductor layer, at least one of the source electrode and the drain electrode including a plurality of protrusions on a side in contact with the second semiconductor layer and;
a gate electrode provided between the source electrode and the drain electrode,
wherein
a width of the plurality of protrusions becomes narrower from the source electrode or the drain electrode toward the first semiconductor layer.

* * * * *